United States Patent [19]

Woolaway, II

[11] Patent Number: 5,717,208
[45] Date of Patent: Feb. 10, 1998

[54] STARING IR-FPA WITH DITHER-LOCKED FRAME CIRCUIT

[75] Inventor: James T. Woolaway, II, Goleta, Calif.

[73] Assignee: HE Holdings, Inc., Los Angeles, Calif.

[21] Appl. No.: 655,425

[22] Filed: May 30, 1996

[51] Int. Cl.⁶ .............................. G01J 5/24; H01L 31/09
[52] U.S. Cl. ................................ 250/332; 250/334
[58] Field of Search ................................ 250/332, 334, 250/370.08, 208.1

[56] References Cited

U.S. PATENT DOCUMENTS

| | | |
|---|---|---|
| 4,220,967 | 9/1980 | Ichida et al. . |
| 4,670,653 | 6/1987 | McConkle et al. ............ 250/370.08 X |
| 4,786,831 | 11/1988 | Morse et al. . |
| 4,952,809 | 8/1990 | McEwen ................. 250/334 X |
| 4,956,716 | 9/1990 | Hewitt et al. . |
| 4,975,864 | 12/1990 | Sendall et al. . |
| 4,978,872 | 12/1990 | Morse et al. . |
| 5,043,820 | 8/1991 | Wyles et al. . |
| 5,113,076 | 5/1992 | Schulte . |
| 5,276,319 | 1/1994 | Hepfer et al. ..................... 250/332 X |
| 5,323,334 | 6/1994 | Meyers et al. . |
| 5,457,331 | 10/1995 | Kosai et al. . |
| 5,514,865 | 5/1996 | O'Neil ................................. 250/208.1 |

*Primary Examiner*—Edward J. Glick
*Attorney, Agent, or Firm*—W. C. Schubert; W. K. Denson-Low

[57] ABSTRACT

An improved imaging technique is disclosed wherein an output from an IR-FPA (16) corresponds to image motion, wherein a scene image stays correlated with the IR-FPA readout, and wherein non-uniformities (e.g., fixed pattern spatial noise) are uncorrelated from frame to frame. The uncorrelated fixed pattern spatial noise is identified and removed by a signal processor, such as a SB-NUC block (24). The scene image is scanned over the IR-FPA by a dither mirror (14) in synchronism with the movement of a frame of pixels (17) on the IR-FPA. Electronics (16a, 16b, 30, 32, 34) are included on the IR-FPA for controlling the scanning and read out of pixels within a currently selected frame.

18 Claims, 2 Drawing Sheets

STARING IR-FPA WITH DITHER-LOCKED FRAME CIRCUIT

FIELD OF THE INVENTION

This invention relates generally to detectors of electromagnetic radiation and, in particular, to circuits and methods for detecting electromagnetic radiation within the infrared (IR) radiation spectral band.

BACKGROUND OF THE INVENTION

A staring imaging system is a system wherein IR radiation emanating from a scene is directed to an area array radiation detector or sensor (e.g., a focal plane array or FPA) without scanning the IR radiation over the detector. The IR-FPA is comprised of a plurality of individual detector sites or pixels, such as an array of nxm pixels (e.g., 256×256 pixels). However, the performance of many IR staring imaging systems is limited by fixed pattern noise. Fixed pattern noise manifests itself by a gradual deterioration of image quality when the position of the IR-FPA, such as an array comprised of Group IIB-VIA material (e.g., mercury-cadmium-telluride or HgCdTe), is relatively fixed with respect to the incident scene radiation.

To address this problem, some types of IR-FPA sensors can be cooled to lower temperatures, thereby reducing the fixed pattern noise. However, the required cooling adds complexity and cost to the imaging system. The effects of fixed pattern noise furthermore severely limit the ability of the imaging system to achieve desired performance levels when using thermal electric (TE) coolers, as opposed to conventional cryogenic cooling assemblies.

It is known to use so-called "micro-dithering" techniques to continuously re-position the incident IR radiation on the surface of the IR-FPA sensor to sub-pixel accuracy. The micro-dithering of the scene radiation seeks to avoid the continuous illumination of each pixel with the same portion of the scene radiation, thereby providing an increased spatial sampling of the scene and an increased resolution of the image.

It has also been known to, employ so-called "scene based nonuniformity correction", or SB-NUC, correction techniques and algorithms to reduce fixed pattern noise. Reference in this regard can be had to the following commonly assigned U.S. Patents: U.S. Pat. No. 4,975,864, issued Dec. 4, 1990, entitled "Scene Based Nonuniformity Compensation for Staring Focal Plane Arrays" by R. Sendall et al., and U.S. Pat. No. 5,323,334, issued Jun. 21, 1994, entitled "Sensor System Having Nonuniformity Suppression With Image Preservation", by F. J. Meyers et al.

In general, imaging systems utilizing SB-NUC rely on blurring optics or on scene movement to separate the signal from the spatial fixed pattern noise. However, in some applications the use of blurring optics is undesirable. Furthermore, in some applications the movement of the scene being viewed cannot be guaranteed. One such example is where a low light or night vision system (e.g., hand-held or tripod mounted) is expected to view or monitor a particular scene for an extended period, and where movement of objects within the scene may not occur, if at all, for long periods of time.

More particularly, SB-NUC algorithms rely on spatial movement of the scene with respect to the sensor pixels. This movement allows the SB-NUC algorithm to separate the spatial signal content of the scene from the spatial signal artifacts generated in the IR-FPA (e.g., fixed pattern noise).

The SB-NUC algorithms, after separating out the fixed pattern noise, are generally designed to suppress this noise signal. This process results in the enhanced performance of the IR-FPA in detecting the scene signal. Current SB-NUC algorithms work well in systems where scene motion is guaranteed. However, not all IR-FPA system applications can assure scene movement. Soldier night vision systems, such as night vision scopes, are an example of an application where scene motion cannot be assured. In systems where scene movement is not guaranteed, the scene signal can become indistinguishable from the fixed pattern noise, and may thus also be suppressed by the operation of the SB-NUC algorithm. This can result in the scene image "disappearing" where it is not moving with respect to the sensor pixels.

It is noted that the above-referenced Meyers et al. patent overcomes this effect of the NUC algorithm by causing a physical movement of the image sensor.

It is also known in the art to provide for so-called IR-FPA "sub-windowing", wherein a small "window" of the IR-FPA pixels are electronically readout from the larger IR-FPA pixel field. This technique can be used to examine a portion of the scene viewed by the IR-FPA.

OBJECTS OF THE INVENTION

It is a first object of this invention to provide an improved IR-FPA imaging system that overcomes the foregoing and other problems.

It is another object of this invention to provide an imaging technique that employs a single, fixed-format (nxm) frame at the sensor output that is moved in single pixel steps or increments in synchronism with a dithered scene movement.

SUMMARY OF THE INVENTION

The foregoing and other problems are overcome and the objects of the invention are realized by methods and apparatus in accordance with embodiments of this invention, wherein an imaging system includes on-Focal Plane Array (on-FPA) circuitry that significantly improves the performance of the IR-FPA when using Scene Based Non-Uniformity Correction (SB-NUC) processing electronics and algorithms.

In a presently preferred embodiment of this invention an IR-FPA imaging system synchronizes a dithered scene image to an electronically dithered fixed format IR-FPA readout. This technique is referred to herein as a Dither-Locked (D-Locked) readout. The D-Locked IR-FPA provides a separation of the spatial signal from the IR scene from the spatial signal artifacts generated in the IR-FPA (e.g., fixed pattern spatial noise). This separation occurs prior to the integration and multiplexing processes of the IR-FPA. This separation thus beneficially enables the IR-FPA readout signal to be processed by known types of SB-NUC algorithms, regardless of the presence or absence of scene movement relative to the IR-FPA pixels.

Further in accordance with this invention the IR-FPA is constructed to include circuits that enable a fixed format frame of IR-FPA pixels to be readout, wherein the pixel frame is moved within the larger pixel field synchronously with the system dithered scene image. Fixed binary locations for both scene position and readout window position may be specified and controlled, thus allowing algorithm-based patterned movement between scene and fixed pattern signals.

An improved imaging technique is thus disclosed wherein an output from an IR-FPA corresponds to image motion, wherein a scene image stays correlated with the IR-FPA readout, and wherein non-uniformities (e.g., fixed pattern spatial noise) are uncorrelated from image field to image field. The uncorrelated fixed pattern spatial noise is identified and removed by a signal processor, such as by a SB-NUC block. The scene image is scanned over the IR-FPA by a dither mirror in synchronism with the movement of a frame of pixels within the larger pixel field of the IR-FPA. Electronics are included on the IR-FPA for controlling the scanning and read out of pixels within a currently selected frame of pixels.

The teaching of this invention is thus compatible with approaches that employ a variable sized window of pixels.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
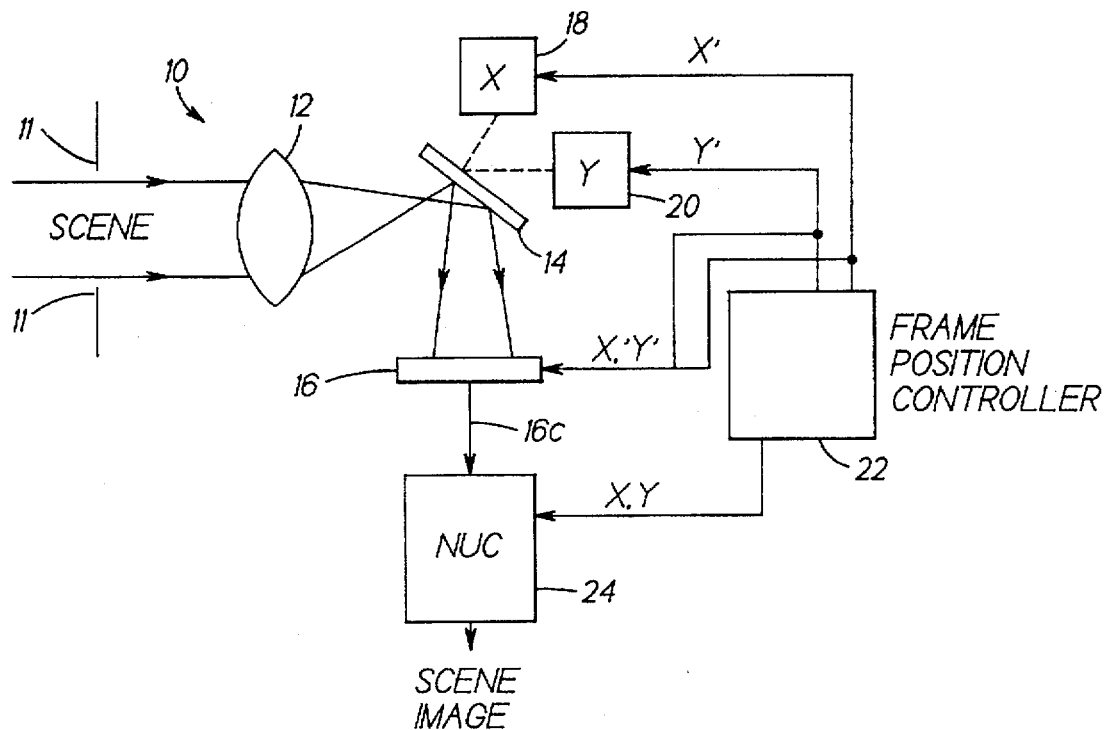
FIG. 1 is a simplified block diagram, partly in schematic diagram form, of an IR-FPA imaging system that is constructed and operated in accordance with this invention.

Reference is now made to FIG. 1 for illustrating an IR radiation imaging system 10 that is constructed and operated in accordance with this invention. Electromagnetic radiation, such as IR radiation from a scene of interest, enters the system 10 through an entrance aperture 11 and is collected and focused with a suitable means, such as with a shaped reflector or with a lens 12. The scene image is then folded by use of a mirror 14 and is directed therefrom to a radiation receiving surface of an IR-FPA 16. The mirror 14 is coupled to suitable x-axis and y-axis actuators 18 and 20, respectively, such as piezoelectric actuators, for being controllable repositioned along two axes. As such, the pointing direction of the mirror can be controlled relative to the radiation receiving surface of the IR-FPA 16. This controllable repositioning of the mirror 14 is referred to herein as "dithering" or "microdithering". The movement of the mirror 14 preferably corresponds to a movement of the IR scene radiation by an amount proportional to a dimension of a single pixel, or a fraction of a pixel dimension, upon the radiation receiving surface of the IR-FPA 16. The mirror 14 thus controllably positions the IR scene signal on the IR-FPA 16 for integration and readout multiplexing.

One suitable, but not limiting, type of IR-FPA detector and associated readout circuit is described in U.S. Pat. No. 4,786,831, issued Nov. 22, 1988, entitled "Integrating Capacitively Coupled Transimpedance Amplifier", by A. L. Morse et al. Another is described in U.S. Pat. No. 5,043,820, issued Aug. 27, 1991, entitled "Focal Plane Array Readout Employing One Capacitive Feedback Transimpedance Amplifier For Each Column", by R. H. Wyles et al. Each IR radiation detector pixel can be responsive to a single band of wavelengths, or can be responsive to more than one band. Suitable embodiments of two or greater band or "color" IR detectors are disclosed in, by example, U.S. Pat. No. 5,113,076, issued May 12, 1992, entitled "Two Terminal Multi-band Infrared Radiation Detector", by E. F. Schulte, and in U.S. Pat. No. 5,457,331, issued Oct. 10, 1995, entitled "Dual-Band Infrared Radiation Detector Optimized for Fabrication in Compositionally Graded HgCdTe", by K. Kosai et al.

Still referring to FIG. 1, the IR radiation imaging system further includes a frame position controller 22 having positioning outputs x' and y' connected to the mirror actuators 18 and 20 and to the IR-FPA 16, and corresponding x and y position indicator outputs that are connected to a SB-NUC block 24. The frame position controller 22 operates, in accordance with this invention, to synchronize the motion of the mirror 14 to the movement of a sub-set or frame of pixels within the IR-FPA 16, and to also provide signals (x and y) to the SB-NUC block 24 that are indicative of these motions. The frame of pixels is preferably a fixed-size frame, although the invention could be practiced using a frame that has a variable size.

One suitable embodiment of the SB-NUC block is described in the above-referenced U.S. Pat. No. 4,975,864, issued Dec. 4, 1990, entitled "Scene Based Nonuniformity Compensation for Staring Focal Plane Arrays" by R. Sendall et al. Reference can also be had to the above-referenced U.S. Pat. No. 5,323,334, issued Jun. 21, 1994, entitled "Sensor System Having Nonuniformity Suppression With Image Preservation", by F. J. Meyers et al. The disclosures of these two patents are incorporated by reference herein in their entireties.

Figure 2:
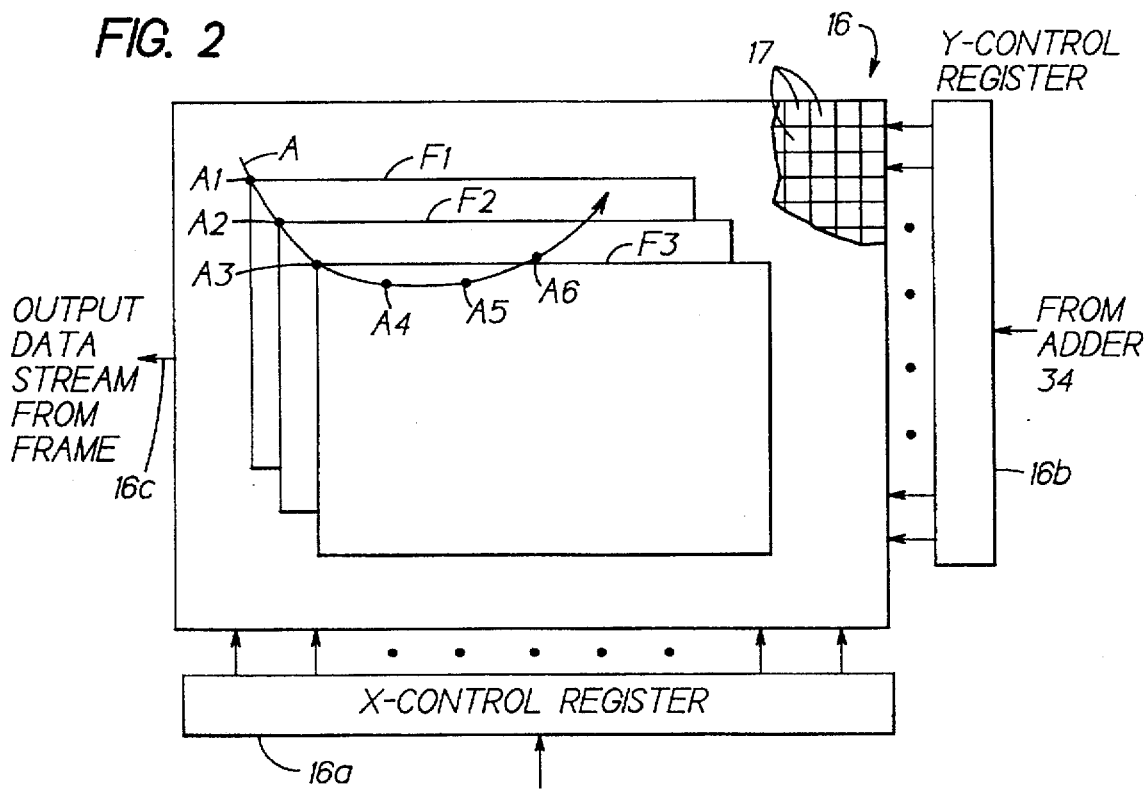
FIG. 2 is a simplified, enlarged top view of an IR-FPA constructed in accordance with this invention, and which furthermore illustrates the movement of a pixel frame within a larger pixel field.

FIG. 2 illustrates the D-Locked IR-FPA 16 of this invention. The IR-FPA 16 has a radiation receiving surface and is comprised of an array of individual pixels 17, only some of which are shown. By example only, the array may comprise 256×256 pixels, or 320×240 pixels, or 640×480 pixels. The IR-FPA 16 may be a front-side or a back-side illuminated device.

Figure 4:
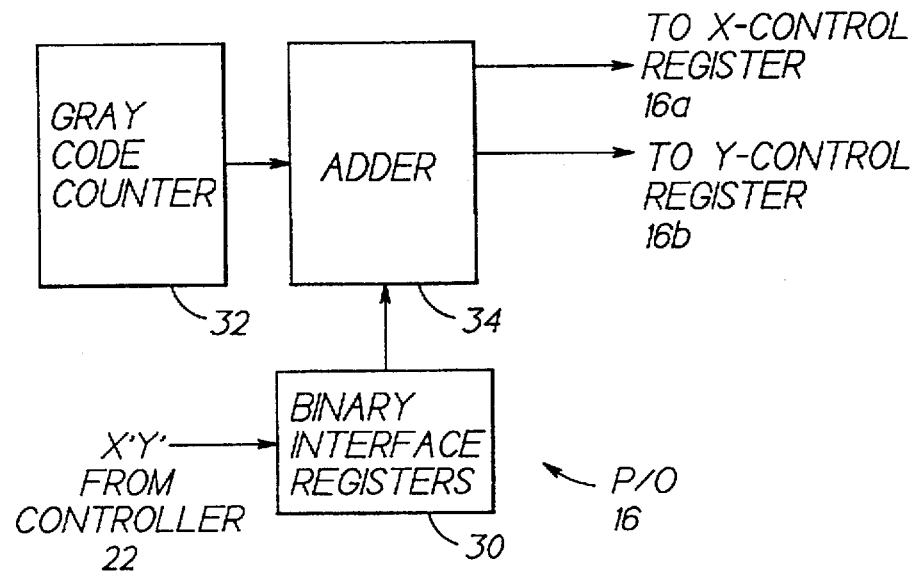
FIG. 4 is a block diagram of IR-FPA dither locked control circuitry.

The IR-FPA 16 is constructed to include an x-control register 16a and a y-control register 16b which receive array x-axis and array y-axis control signals, respectively, from the electronics illustrated in FIG. 4. The x-axis and y-axis control signals control the selection of pixels that are read out to form the IR-FPA output data stream from a currently selected frame of pixels. The x-axis and y-axis control signals are derived from the x' and y' signals, as will be described below. The registers 16a and 16b provide a capability to read out a fixed format array size (i.e., a nominally rectangular or square shaped sub-set or frame of pixels 17) within a larger detector array field. The location of each fixed format readout frame within the larger detector array field is system configured by binary addressing and/or is derived by logic on the IR-FPA 16.

For the purposes of illustration a binary-approximated elliptical readout pattern is shown in FIG. 2 by the arrow designated "A". Here the locations of three successive frames of scene data are shown. Each frame of scene data is obtained from an associated rectangular pixel frame (F1–F3). The origins of F1–F3 are designated as A1–A3, respectively. The origins of three successive frames (not illustrated) are designated as A4–A6. As is apparent, the frame origins lie on the ellipse A and progressively shift counter-clockwise about the ellipse. A full dither cycle brings a fixed frame origin fully around the ellipse.

The ellipse is but one exemplary frame movement pattern, and the invention is not limited for use with only this one pattern. In general, it is desirable to use a pattern that resembles a Lissajous pattern, i.e., a pattern representing one of several curves resulting from the combination of two harmonic motions. The selected pattern is also preferably one that would not normally result from an actual motion of the scene with respect to the imaging system 10. The selection of a given pattern may also be based on the nature of the fixed pattern noise, as a function of a given IR-FPA and system, and may be adaptively varied. By example, if the horizontal spatial noise is greater than the vertical, then the selected pattern may resemble a figure eight.

The dither mirror 14 shown in FIG. 1 provides scene image movement consistent with the fixed readout frame origin movement, and is synchronized with the shifting of the frame origin about the IR-FPA pixel array. A given fixed point in the scene image is thus incident on and is integrated by different pixels through the dither cycle. As the position of the image of a fixed point in the scene image moves over the array of pixels 17, the frame or frame of "active" pixels also moves in synchronism with the image, under the control of the x-control register 16a and the y-control register 16b. In that the dither mirror 14 and readout frame locations on the IR-FPA 16 are thus "locked" or synchronized by the operation of the frame position controller 22, the resulting scene image from the IR-FPA remains stationary in the IR-FPA output data stream 16c that is input to the SB-NUC block 24.

Figure 3:
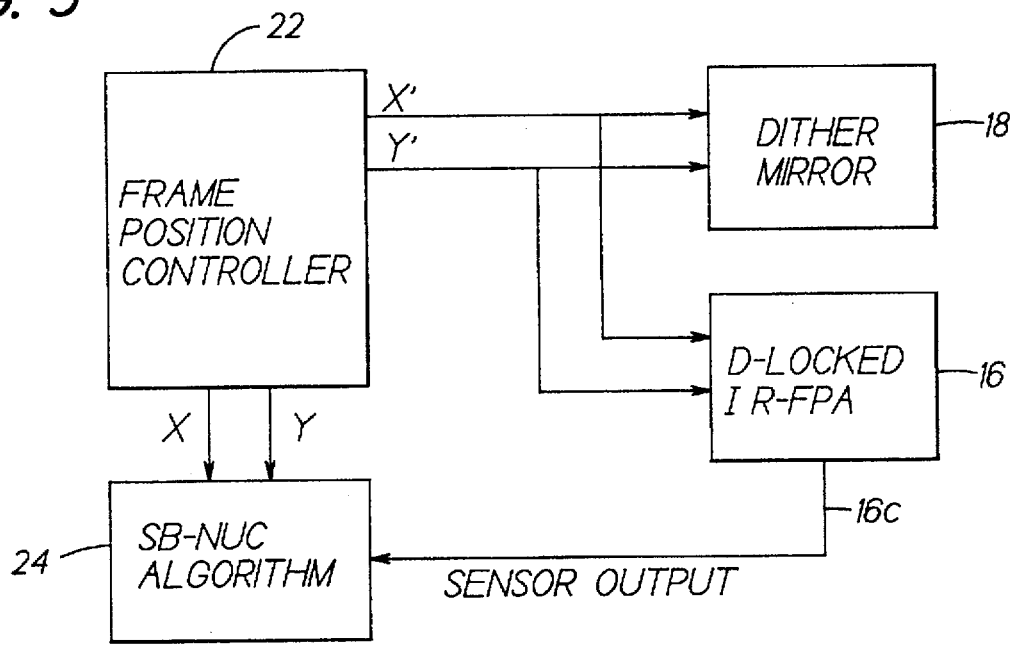
FIG. 3 is a block diagram of the IR-FPA imaging system of FIG. 1.

FIG. 3 illustrates the control system for the D-Locked Sensor configuration. The frame position controller 22 is used to control the position of the dither mirror 14, the position of the readout frame of the IR-FPA 16, and the position of the SB-NUC processor 24'. The coordinates x' and y' are output to the IR-FPA 16 and to the dither mirror 14, and are determined so as enable the frame location to follow the desired mirror dither movement pattern. The 5 dither mirror 14 and D-Locked IR-FPA 16 are initially aligned one to another such that identical coordinates (x' and y') for the dither mirror 14 and frame of the IR-FPA 16 result in optical alignment to the scene image. The coordinates x and y, which are absolute IR-FPA pixel coordinates, are output to the SB-NUC block 24. For example, and referring to U.S. Pat. No. 5,323,334, the x and y values can form the motion command 34 to the motion controller 36.

The result is that for the IR-FPA sensor data output the scene image remains stationary While the sensor fixed pattern noise moves from frame to frame in accordance with the selected dither pattern. However, SB-NUC data operates in the opposite manner. That is, IR-FPA pattern noise appears to be stationary and fixed to the absolute pixel coordinates of the IR-FPA 16, while the scene signal moves in accordance with the selected dither pattern. This technique thus beneficially enables the SB-NUC block 24 to average out the signal while deriving the fixed pattern image information. The SB-NUC block 24 thus removes all or substantially all of the fixed pattern spatial noise from the scene signal data stream, which is the desired result. Furthermore, the removal of the fixed pattern noise without a significant loss of scene image data can be accomplished while the scene is stationary with respect to the imaging system 10, and without requiring a physical movement or scanning of the IR-FPA 16.

FIG. 4 illustrates in greater detail the frame position readout circuitry that is preferably disposed internal to the IR-FPA 16. A gray code counter 32 is used to count the frame size in x-axis and y-axis pixel increments (i.e., along rows and columns of pixels). A gray code counter is preferred over a conventional binary counter in order to eliminate undefined states during transitions of the counter outputs. An offset is added to the output of the counter 32 with adder 34 to cause the count start and stop values to shift by the offset value (i.e., by x' and y'). A pair of binary interface registers 30 allow x' and y' offset values to be loaded from the frame position controller 22, thereby setting the frame origin when the gray code counter is reset to zero to begin a new pixel frame. Subsequent counter x and y axis positions are thus made relative to the x' and y' values stored in the binary interface registers 30.

For example, if it is assumed that the counter 32 is programmed to count from 0 to 319 in horizontal pixel locations and from 0 to 239 in vertical pixel locations, and if x' is equal to 10 and y' is equal to 5, then the output of the adder 34 will have values from 10 to 329 along the x-axis and from 5 to 244 along the y-axis. The actual read out of the pixels within a current frame comprised of n×m pixels can proceed in column/row fashion (i.e., for a selected row m, read out columns 0–n, increment m, then read out columns 0–n for row (m+1), etc.).

By example, if x', y' were established at the center axis of the frame, and assuming for this example the IR-FPA is a 352×272 device, then the absolute x, y values would be 176, 136, while the relative x', y' values would be 160, 120. As was described previously, the SB-NUC is referenced to the absolute coordinate values.

Based on the foregoing examples it can be appreciated that, due to the movement of the frame about the IR-FPA pixel field, the IR-FPA array size should be made larger than the frame size. By example, for a desired frame or frame size of 320×240 pixels, and for a desired 16 pixel dither relative to a center axis of the IR-FPA, a suitable minimum IR-FPA size is 352×272 pixels (i.e., 32 pixels greater than the frame size along both the array x and y axes (i.e., column and row) dimensions).

In a first embodiment of the invention the dither mirror 14 and the IR-FPA frame electronics are synchronized so as to move in one pixel increments. That is, the position of the frame shifts in x and y by one pixel increments. For each one pixel shift a frame of scene radiation is integrated and then read out to the SB-NUC block 24 for fixed pattern noise correction.

In a second embodiment of the invention the dither mirror 14 and the IR-FPA frame electronics are synchronized such that for each one pixel IR-FPA frame increment the dither mirror 14 is moved by a plurality of sub-pixel increments. By example, the frame is set at a particular x' and y' location, and the dither mirror 14 is then "micro-dithered" by fractional x' and y' values so as to scan the scene image over the frame pixels by some fractional pixel dimension (e.g., by 0.1, or 0.25, or 0.5 pixel dimension). In this manner a plurality (e.g., 10, 4, 2) scene images are integrated and read out for each frame position. After scanning the scene image over the pixels at the selected micro-dither resolution, the x' and y' values to the IR-FPA 16 are changed to select the next frame location, and the dither mirror is then once again scanned over the pixels within the new frame position.

The maximum frame and mirror scanning rate is a function of the minimum time required to integrate the IR scene radiation and to read out the pixels within the current frame position. For some applications it is desired to obtain a 30 Hz frame rate.

Based on the foregoing description it can be appreciated that the teaching of this invention provides an improved imaging technique wherein the output from the IR-FPA corresponds to image motion, wherein the image stays correlated with the IR-FPA readout, and wherein non-uniformities (e.g., fixed pattern spatial noise) are uncorrelated from frame to frame. The uncorrelated fixed pattern spatial noise is then identified and removed by a subsequent signal processor, such as the SB-NUC block 24.

The teaching of this invention can be employed with advantage to all staring IR readout array systems that utilize SB-NUC. The teaching of this invention furthermore enables the use of staring HgCdTe IR-FPA detectors for hand-held night vision systems, where fixed pattern noise would otherwise limit their application. In general, the teaching of this invention can be employed in any staring sensor system where fixed pattern noise or bad pixels raises a performance issue. Furthermore, the teaching of this invention can be employed with advantage with uncooled, TE-cooled, and cryogenically-cooled detector assemblies.

Furthermore, and in addition to fixed pattern noise suppression, this invention provides additional capabilities in the mitigation of bad pixels. This is possible since the scene passes through different pixels in the array on a frame by frame basis.

Furthermore, and as was alluded to above, the teaching of this invention is also amenable to micro-dithered resolution enhancements. By example, an imaging system constructed and operated in accordance with this invention may use an IR-FPA with fewer pixels (e.g., 320×240). In this case the imaging system then employs micro-dithering of the mirror 14 to obtain a resolution enhancement (e.g., 640×480), a suppression of the spatial noise using a suitable SB-NUC technique, and a mitigation of the effect of any bad pixels of the IR-FPA by using known types of time domain correlation algorithms.

Furthermore, the teaching of this invention can be extended to imaging in other portions of the spectrum besides the IR, can be applied to detectors constructed of other than Group IIB-VIA materials (e.g., HgCdTe), such as detectors constructed of Group IrA (e.g., Si, Ge) and Group IIIA-VA (e.g., GaAs, AlGaAs) materials. In general, the teaching of this invention is applicable to any array of sensor elements, wherein sensor element to sensor element non-uniformitieas are a factor in the operation of the array.

Thus, while the invention has been particularly shown and described with respect to preferred embodiments thereof, it will be understood by those skilled in the art that changes in form and details may be made therein without departing from the scope and spirit of the invention.

What is claimed is:

1. An imaging system, comprising:
   an entrance aperture for admitting electromagnetic radiation conveying an image of a scene;
   a radiation detector array comprised of a plurality of pixels;
   a mirror interposed between said entrance aperture and said array for directing the electromagnetic radiation to said pixels;
   means for effecting a movement of said mirror with respect to said pixels for moving said scene image from a first selected plurality of pixels to a second selected plurality of pixels and for reading out signals from a currently selected plurality of pixels, the signals resulting at least in part from a detection by the currently selected plurality of pixels of the electromagnetic radiation that conveys the scene image; and
   means, having an input coupled to an output of said radiation detector array, for processing said signals to reduce an effect of array fixed pattern spatial noise; wherein
   said radiation detector array is comprised of circuitry for defining a boundary of the currently selected plurality of pixels and for controlling a readout of the signals from within the boundary of the currently selected plurality of pixels.

2. An imaging system as set forth in claim 1, and further comprising control means having outputs for specifying a pointing direction of said mirror, for specifying a location of a selected plurality of said pixels relative to a specified mirror pointing direction, and for specifying a location of the selected plurality of pixels to said processing means.

3. An imaging system as set forth in claim 1, wherein said processing means is comprised of means for executing a scene based non-uniformity correction on said signals.

4. An imaging system as set forth in claim 1, and further comprising means for focussing said electromagnetic radiation onto said mirror.

5. An imaging system as set forth in claim 1, wherein said scene image is moved in integer pixel increments.

6. An imaging system as set forth in claim 1, wherein said scene image is moved in fractional pixel increments.

7. An imaging system as set forth in claim 1, wherein said scene image is moved in a repeating pattern over said plurality of pixels of said array.

8. An imaging system as set forth in claim 7, wherein said repeating pattern is a Lissajous pattern.

9. An imaging system as set forth in claim 1, wherein said circuitry is comprised of a counter for generating radiation detector array row and column counts and means for adding an offset value to said row and column counts, the offset value being indicative of a location of the currently selected plurality of pixels.

10. An IR radiation imaging system, comprising:
    an entrance aperture for admitting IR radiation conveying an image of a scene;
    an IR-FPA comprised of rows and columns of pixels;
    a mirror interposed between said entrance aperture and said IR-FPA for directing the IR radiation to said pixels;
    control means having a first output for specifying a pointing direction of said mirror with respect to said pixels, said first output causing said pointing direction to change for moving said scene image over said IR-FPA in a predetermined pattern;
    said IR-FPA comprising circuitry for specifying the location and boundaries of a frame of pixels as a function of said control means first output and for reading out signals from pixels within the frame, the signals comprising a first desired component representing a detection by the pixels within the frame of the IR radiation that conveys the scene image, and a second, undesired component that includes fixed pattern spatial noise; and
    scene based non-uniformity correction means, having a first input coupled to an output of said IR-FPA and a second input coupled to a second output of said control means, for processing said signals to substantially eliminate said fixed pattern spatial noise.

11. An imaging system as set forth in claim 10, and further comprising means for focussing said IR radiation onto said mirror.

12. An imaging system as set forth in claim 10, wherein both said scene image and said frame are moved in synchronism in integer pixel increments.

13. An imaging system as set forth in claim 10 wherein said frame is moved in synchronism with said scene image, said frame being moved in integer pixel increments and said scene image being moved in fractional pixel increments.

14. An imaging system as set forth in claim 10, wherein said predetermined pattern is a Lissajous pattern.

15. An imaging system as set forth in claim 10, wherein said IR-FPA circuitry is comprised of a counter for generating row and column counts and means for adding an offset value to said row and column counts, the offset value being obtained from said first output of said control means.

16. A method for operating an IR imaging system, comprising the steps of:

scanning an image of a scene over a radiation receiving surface of an IR-FPA in a predetermined pattern;

reading out IR radiation-induced signals from a frame of IR-FPA pixels within a larger pixel field, the signals being read out of a frame of pixels whose position is moved in synchronism with the scanning of the image whereby the scene image remains correlated with the IR-FPA readout, and whereby non-uniformities are uncorrelated from frame position to frame position, wherein the reading out the frame is accomplished at least in part by electronic circuits that comprise the IR-FPA and that define boundaries of a currently selected frame of pixels; and subtracting a non-uniformity signal component from the signals read out from the frame.

17. A method as set forth in claim 16, wherein the pattern is a Lissajous pattern.

18. A method as set forth in claim 16, wherein the step of subtracting is accomplished during the execution of a scene based nonuniformity correction algorithm.

* * * * *